United States Patent [19]
Chang et al.

[11] Patent Number: 5,559,055
[45] Date of Patent: Sep. 24, 1996

[54] METHOD OF DECREASED INTERLAYER DIELECTRIC CONSTANT IN A MULTILAYER INTERCONNECT STRUCTURE TO INCREASE DEVICE SPEED PERFORMANCE

[75] Inventors: Mark S. Chang, Los Altos; Robin W. Cheung, Cupertino, both of Calif.

[73] Assignee: Advanced Micro Devices, Inc., Sunnyvale, Calif.

[21] Appl. No.: 360,857

[22] Filed: Dec. 21, 1994

[51] Int. Cl.⁶ .................................................. H01L 21/44
[52] U.S. Cl. ........................... 437/195; 437/228; 437/235; 148/DIG. 50
[58] Field of Search ...................... 437/195, 228, 437/235; 148/DIG. 50

[56] References Cited

U.S. PATENT DOCUMENTS

| | | |
|---|---|---|
| 4,820,611 | 4/1989 | Arnold, III et al. ............... 430/271 |
| 4,974,055 | 11/1990 | Haskell . |
| 4,977,108 | 12/1990 | Haskell ............................ 437/229 |
| 4,996,133 | 2/1991 | Brighton et al. . |
| 5,028,555 | 7/1991 | Haskell ............................ 437/57 |
| 5,055,427 | 10/1991 | Haskell ............................ 437/203 |
| 5,057,902 | 10/1991 | Haskell ............................ 357/71 |
| 5,081,516 | 1/1992 | Haskell ............................ 357/42 |
| 5,117,276 | 5/1992 | Thomas et al. . |
| 5,171,713 | 12/1992 | Matthews ......................... 437/189 |
| 5,187,121 | 2/1993 | Cote et al. ....................... 437/195 |
| 5,413,962 | 5/1995 | Lur et al. ......................... 437/195 |
| 5,442,237 | 8/1995 | Hughes et al. ................... 257/759 |

*Primary Examiner*—George Fourson
*Assistant Examiner*—C. Everhart
*Attorney, Agent, or Firm*—Benman Collins & Sawyer

[57] ABSTRACT

The RC time constant of a semiconductor device is reduced by decreasing the capacitance C. The decrease in capacitance is achieved by replacing the interlayer silicon dioxide (dielectric constant of 4.0) with air (dielectric constant of 1.0). Alternatively, the air space can also be filled with another low dielectric constant material, such as an organic material having a dielectric constant in the range of about 2.2 to 3.4. In either case, the final effective dielectric constant of the device is lowered. As a result of lowering the effective dielectric constant, a smaller RC time constant is achieved, which results in higher device speed.

17 Claims, 3 Drawing Sheets

METHOD OF DECREASED INTERLAYER DIELECTRIC CONSTANT IN A MULTILAYER INTERCONNECT STRUCTURE TO INCREASE DEVICE SPEED PERFORMANCE

TECHNICAL FIELD

The present invention relates generally to multilevel interconnects employed in semiconductor devices, and, more particularly, to increasing the speed of operation of such devices.

BACKGROUND ART

The present integrated circuit devices comprise a silicon substrate, doped regions in the substrate to which source or drain connections are made, separated by a gate control region. Metal connections to the source, gate, and drain electrodes is made by multilayer interconnects, which are supported over the substrate by an interlayer dielectric.

The integrated circuit device speed is a function of the RC (resistance and capacitance) time constant of the multilayer metal interconnect. For a higher speed performance, the RC time constant must be reduced. The dielectric material used in the interlayer structure is typically silicon dioxide, which has a dielectric constant about 4, and it is the source of C (capacitance). The interconnect material is typically aluminum or, more commonly, an aluminum alloy including a small amount (about 1%) of copper, silicon, or titanium. The interconnect material typically comprises a multilayered structure of titanium/titanium nitride/aluminum (alloy)/titanium nitride, such as, for example, Ti/TiN/Al-1% Cu/TiN. The interconnect layer is the source of R (resistance).

In order to achieve an increase in device speed, the RC time constant must be reduced. A reduction in the RC time constant may be achieved by decreasing the capacitance C or the resistance R or both.

DISCLOSURE OF INVENTION

In accordance with the present invention, the RC time constant of a semiconductor device is reduced by decreasing the capacitance C. The decrease in capacitance is achieved by replacing the interlayer silicon dioxide (dielectric constant of about 4) with air (dielectric constant of 1). Alternatively, the air space can also be filled with another low dielectric constant material. In either case, the final effective dielectric constant of the device is lowered. As a result of lowering the effective dielectric constant, a smaller RC time constant is achieved, which results in higher device speed.

The semiconductor device comprises source and drain regions contacted by source and drain contacts, respectively, and each source and drain region is separated by a gate region contacted by a gate electrode. A first level patterned interconnect contacts the source and drain contacts and the gate electrode in a desired pattern and a second level patterned interconnect contacts the first level patterned interconnect with a plurality of metal lines. The metal lines are separated by a first interlevel dielectric layer having a dielectric constant less than that of silicon dioxide.

The process for fabricating the semiconductor device having a reduced RC time constant comprises the steps of:

(a) prior to forming source and drain contacts and gate electrode, forming an etch stop layer on the first oxide layer;

(b) forming the gate oxide;

(c) forming the source and drain contacts to respective source and drain regions and gate electrodes over the gate oxide;

(d) forming and patterning the first interconnect layer contacting said source and drain contacts and said gate electrodes;

(e) forming on the patterned first interconnect layer a first interlevel dielectric layer comprising silicon dioxide;

(f) etching vias through said first interlevel dielectric layer and forming metal lines therein contacting portions of the first interconnect layer;

(g) forming and patterning the second interconnect layer contacting the metal lines; and (f) removing at least a portion of the first interlevel dielectric layer.

The first interlevel dielectric layer may be partially or totally removed, leaving air as the dielectric. Alternatively, a comparatively low dielectric constant material may be formed in the air space to partially or completely fill the air space. In any event, the effective dielectric constant of the first interlevel dielectric layer is between 1 and less than 4, depending on design criteria selected by the device fabricator.

Other objects, features, and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

FIGS. 1–5 are cross-sectional views at various stages in the processing of wafers in accordance with the present invention, in which:

FIG. 1 depicts a conventional semiconductor structure prior to performing the first contact masking and etching;

FIG. 2 depicts the structure after the formation of metal contacts and prior to the first metal interconnect patterning step;

FIG. 3 depicts the structure after formation of the silicon dioxide interlevel dielectric layer and metal plugs and prior to the second metal interconnnect patterning step;

FIG. 4 depicts the structure after removal of the silicon dioxide interlevel dielectric layer to provide a device having a reduced RC time constant; and FIG. 5a–c depict different embodiments of the structure following formation of a passivation layer thereon.

BEST MODES FOR CARRYING OUT THE INVENTION

Reference is now made in detail to a specific embodiment of the present invention, which illustrates the best mode presently contemplated by the inventors for practicing the invention. Alternative embodiments are also briefly described as applicable.

A two-layer metal interconnect scheme is presented as an illustration of the method of the present invention. However, it will be readily appreciated that the method of the invention is applicable to any number of metal layers as required in the device. The basic concept is to remove the interlayer silicon dioxide by wet or plasma dry etching, leaving an air space. To refill the air space with another low dielectric constant material is an option.

Figure 1:
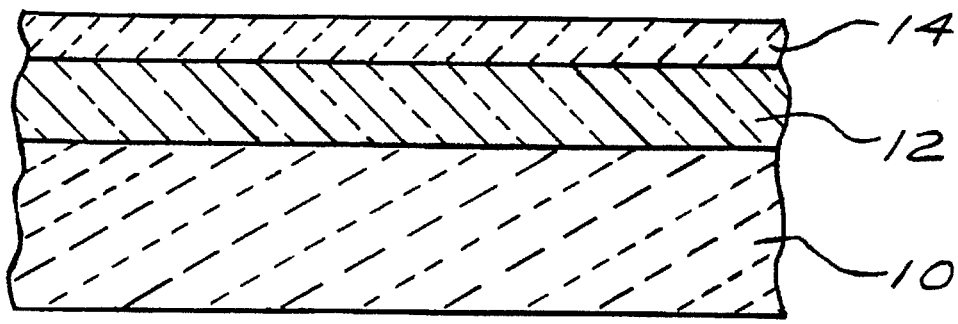

The process procedure of the invention now follows:

Before the first contact masking and etching, an oxide etch stop layer such as silicon nitride of 1,000 Å is deposited on top of the interlayer silicon dioxide. FIG. 1 illustrates the structure of the device at this stage of processing. Specifically, a silicon substrate 10 supports a layer of silicon dioxide 12. The thin silicon nitride layer 14 is deposited on top of the oxide layer 12.

The etch stop layer 14 and the oxide layer 12 are then sequentially patterned and etched to form contact openings, which are filled with plugs 16 of an electrically conductive material. As described in a series of patents issued to Jacob D. Haskell and assigned to the same assignee as the present application (U.S. Pat. Nos. 4,974,055; 4,977,108; 5,028,555; 5,055,427; 5,057,902; and 5,081,516), the conductive plug 16 comprises polysilicon, appropriately doped to provide the desired conductivity and subsequently heat-treated to form doped regions 18, 20 in the silicon substrate 10. Or, the conductive plug may comprise a metal, such as tungsten, which contacts previously-doped regions 18, 20. In either case, some plugs 16s then become source contacts and other plugs 16d become drain contacts. Still other plugs 16g, e.g., undoped polysilicon or titanium/titanium nitride/tungsten, are formed over a thin oxide layer 22 or a polysilicon gate oxide layer 23 and become gate electrodes.

Figure 2:
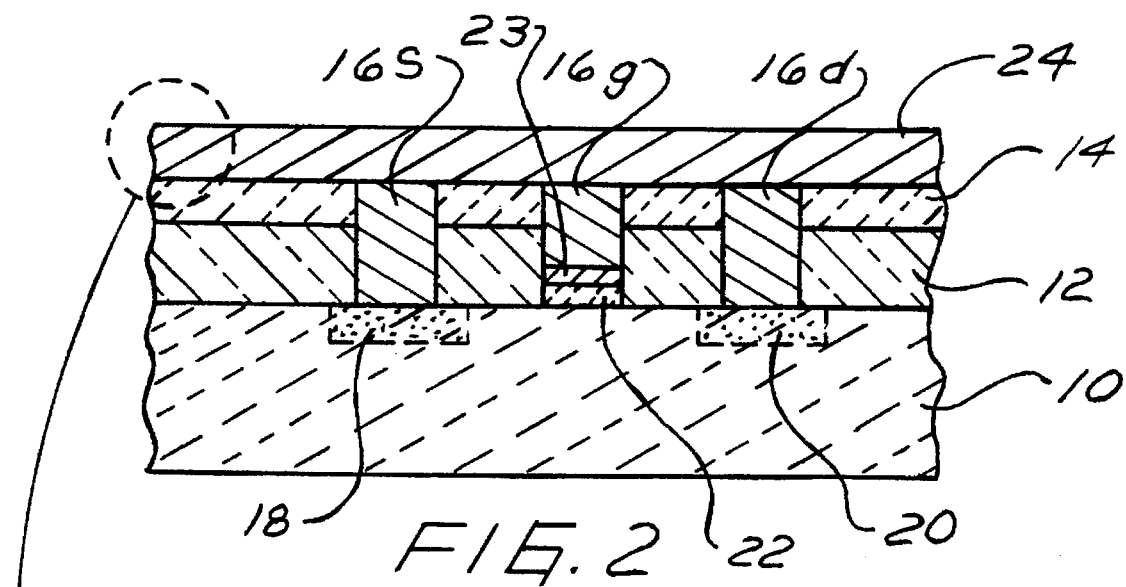

Next, metal interconnects 24 are formed on top of the etch stop layer 14. The resulting structure, prior to patterning and etching the metal interconnects 24, is shown in FIG. 2.

Figure 2A:
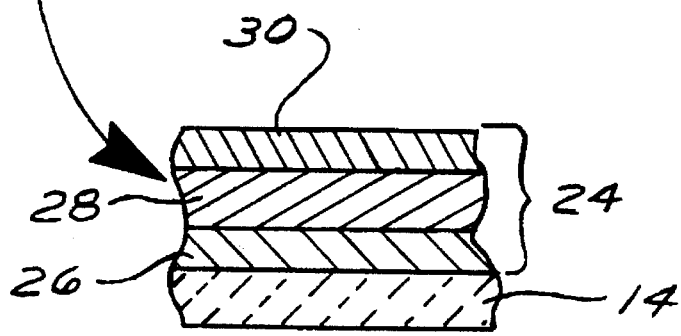
FIG. 2a is a cross-sectional view of an enlarged portion of FIG. 2, showing the details of the metal interconnect structure.

The metal interconnect layer 24 comprises a multilayer structure of a titanium/titanium nitride layer 26, an aluminum or aluminum alloy layer 28, and a titanium nitride layer 30. The multilayer structure is depicted in FIG. 2a. The titanium/titanium nitride layer 26 serves as both an adhesion layer, adhering the subsequent aluminum layer 28 to the silicon nitride layer 14, and as a barrier layer, preventing the interdiffusion of silicon and aluminum, as are well-known. The titanium/titanium nitride layer 28 is formed by first depositing titanium in a vacuum and then adding nitrogen gas to form titanium nitride thereon. This process is well-known and forms no part of this invention.

The aluminum layer 28 is the current-carrying layer, and is deposited by conventional means. The aluminum layer 28 is preferably doped with a small amount, typically about 1 wt %, of copper, silicon, or titanium, as is well-known.

The top titanium nitride layer 30 is an anti-reflection layer, used to aid in the patterning of the metal interconnect layer 24, as taught in U.S. Pat. No. 4,820,611, issued to William H. Arnold III, et al and assigned to the same assignee as the present application.

The metal interconnect layer 24 is patterned, as taught in the above-mentioned Haskell patents and a planarized oxide layer 32, called an interlevel dielectric layer, is formed everywhere thereon. This is often referred to as the first interlevel dielectric, as there may be additional interlevel dielectrics separating upper metal layers. Typically, the composition of the interlayer dielectric 32 is silicon dioxide, and is formed by conventional chemical vapor deposition procedures.

Figures 3, 4, 5A:
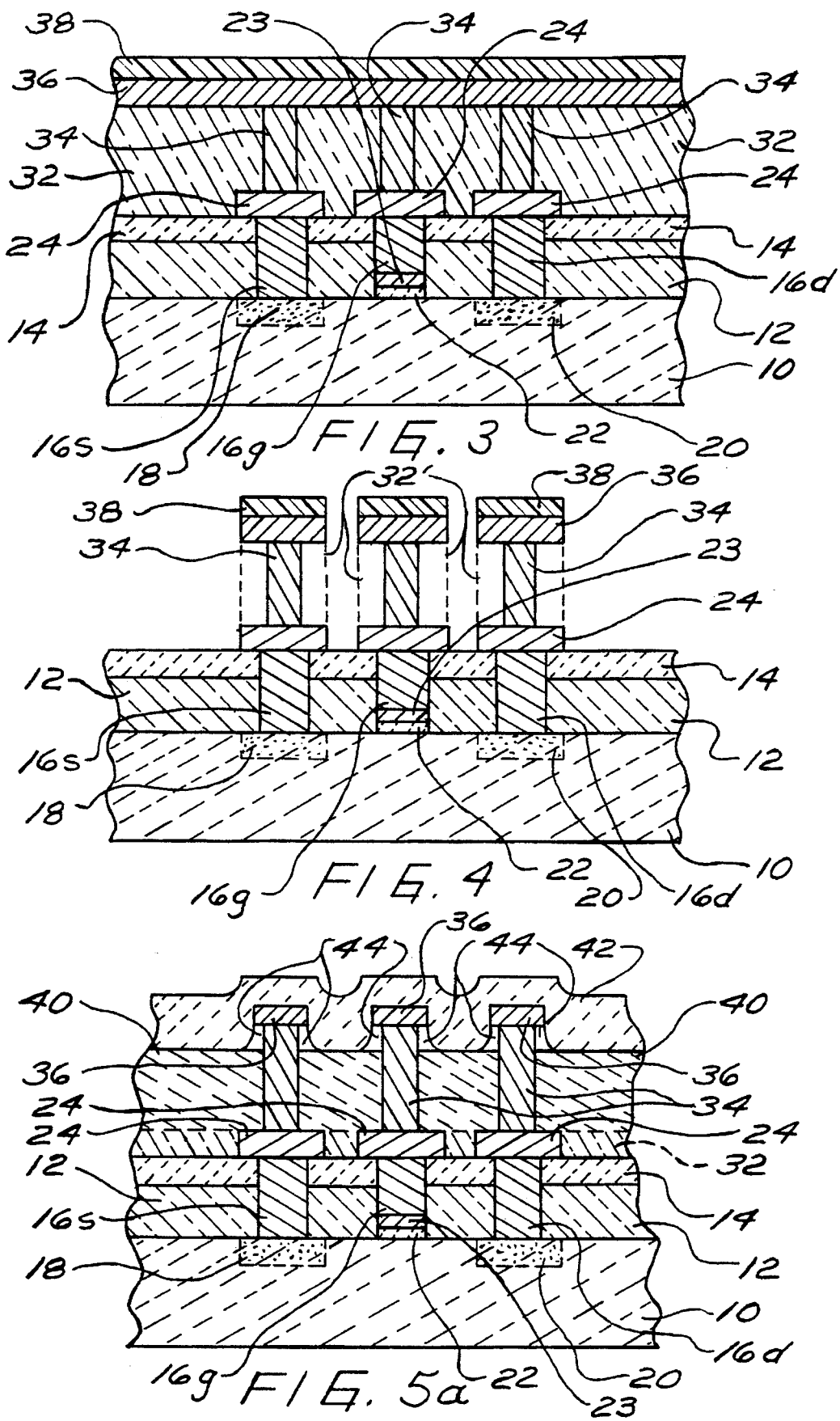

Openings are formed in the oxide 32 by conventional patterning and etching and then filled with a conductive metal 34 to form plugs or lines. A second metal interconnect layer 36 is formed on top of the oxide layer 32, electrically contacting the conductive metal lines 34. The structure is depicted in FIG. 3.

The conductive metal 34 typically comprises titanium/ titanium nitride/tungsten. The second metal interconnect layer 36 comprises the multilayer structure shown in FIG. 2a.

The second metal interconnect layer 36 is next patterned and etched. A resist layer 38, shown in FIG. 3, is used to define the desired interconnect pattern. However, at the second metal interconnect 36 patterning step, the remaining resist 38 after metal interconnect plasma etching is kept after water rinse (the water rinse is done to remove residual chlorine to prevent corrosion).

The silicon dioxide interlayer 32 is then etched away either by wet or dry plasma etching. Either or both isotropic and anisotropic etchings can be used to remove the silicon dioxide 32 in between the metal lines 34 and in between the metal layers 24, 36 without attacking the interconnects. The resist 38 together with the TiN ARC (anti-reflection coating) layer 30 serve as the mask during the oxide etching step. The silicon nitride layer 14 deposited on the oxide layer 12 above now serves as the etch stop, preventing removal of that oxide layer. The resulting structure is shown in FIG. 4.

The thickness of the silicon nitride layer 14 is in the range of about 300 to 1,500 Å, and preferably in the range of about 500 to 1,000 Å. If the silicon nitride layer 14 is too thin, then it will not be effective as an etch-stopping layer. If this layer is too thick, then the effective dielectric constant includes the contribution from silicon nitride, which increases the effective value.

Oxide etching can also be stopped any time as desired before reaching the silicon nitride etch stop layer 14. When the etching is done, the interconnects 36 are left behind, suspended in air with the properly designed and spaced plugs 34 acting as supports of the metal layers. The residual resist 38, if any still remain, can be removed by conventional means. If anisotropic oxide etching is applied, the oxide materials between the metal interconnects 36 and open areas of the metal lines 34 and metal interconnects 24 directly underneath are removed, with the oxide underneath the metal interconnects 36, shown in phantom as 32', serving as additional supports for the metal layers 34 and 36.

The vacant spaces between the metal interconnects 36 can be left open if the metal lines 34 are properly designed and spaced to serve as supports. The vacant spaces can also be filled with another low dielectric constant material 40 by proper means. Examples of appropriate low dielectric constant materials are listed in the Table below.

TABLE

Examples of Low K Dielectric Materials

| Material | Vendor | Dielectric Constant |
| --- | --- | --- |
| Benzocylobutene (BCB) | Dow Chemical | 2.5 |
| Polyimide | | |
| PI-2610 (BPDA-PDA) | du Pont | 3.12 |
| Ultradel 1608D | Amoco | 3.20 |
| Polyimide siloxane | | |
| PSI-N-6002 | Amoco/Chisso | 3.35 |
| Fluoropolyimide | | |
| FPI-45M | du Pont | 2.80 |

TABLE-continued
Examples of Low K Dielectric Materials

| Material | Vendor | Dielectric Constant |
| --- | --- | --- |
| Fluoropolymer CYTOP | Asahi Glass | 2.24 |
| Fully cyclized heterocyclic polymers IP-200 | Camota PPQ | 3.01 |
| Polysiloxane X515 | Allied-Signal | 2.89 |

Figure 5B:
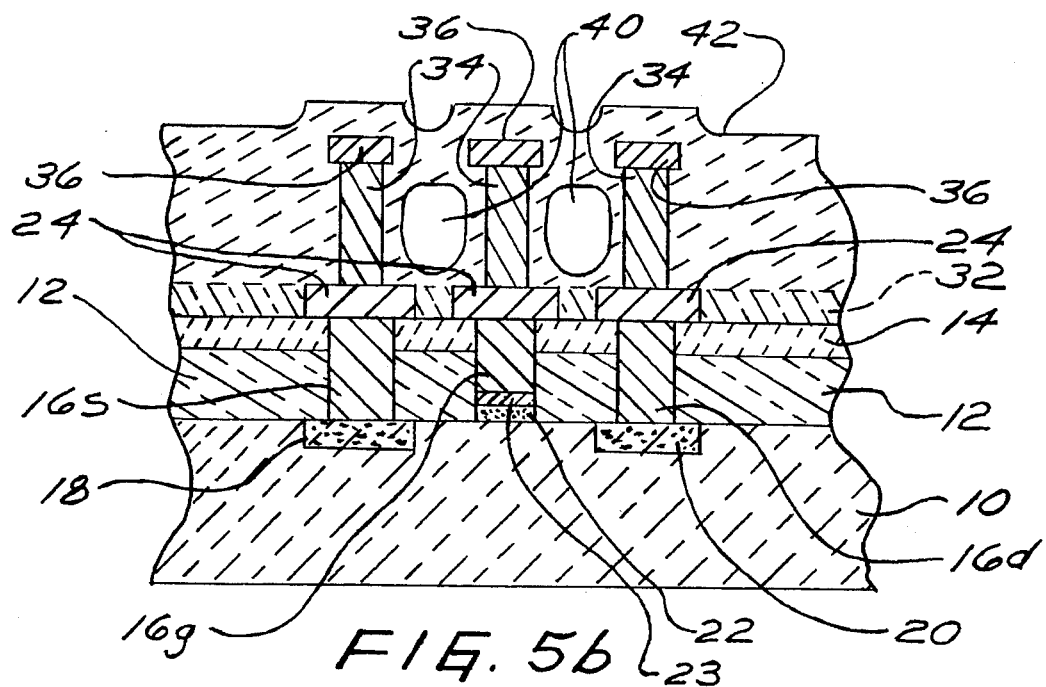
Figure 5C:
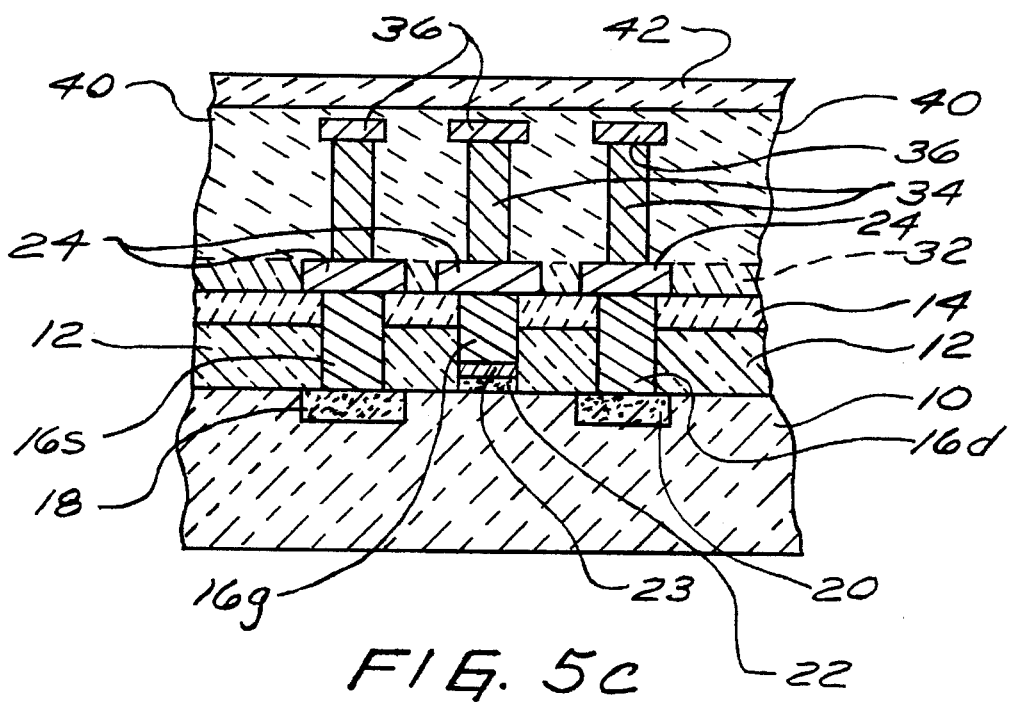

The dielectric materials in the Table all have a dielectric constant in the range of about 2.2 to 3.4. Filling can be done by spin-coating of the material selected. The resulting structure is depicted in FIGS. 5a–c, which include a passivation layer 42, formed by conventional processes. The passivation layer 42 typically comprises silicon nitride.

As shown in FIG. 5a, the passivation layer 42 cannot fill in the newly defined interconnect structure due to the nature of difficulty in filling high depth-to-width aspect ratio. This means that air spaces 44 are left as "voids". On the other hand, FIG. 5b illustrates the situation in which no second dielectric material other than air is employed. The passivation layer 42 covers the plugs 16s, 16g, 16d, but again, leaves voids (air spaces) 44 between the plugs. Finally, FIG. 5c illustrates the situation in which the second dielectric 40 is employed, to the extent of covering the plugs 16s, 16g, 16d; no air spaces are created in this embodiment.

The dielectric material between the metal lines 34 is now either air (i.e., the lowest dielectric constant of 1), or the newly filled dielectric material 40 with lower dielectric constant than the original silicon dioxide 32, or a combination of the air or the low dielectric constant material together with silicon dioxide 32 not completely removed (shown in phantom in FIGS. 5a–c). Nevertheless, the effective dielectric constant of the interconnect 36 is reduced and its value can be somewhere between 1 (i.e., air) and less than 4 (the dielectric constant of silicon dioxide is 4.0). A wide range can accordingly be chosen. With the same metal interconnect materials, the device speed can be significantly improved.

As indicated above, there can be upper interlevel dielectric layers separating patterned metal interconnects. The process of the present invention can be employed with regard to such upper interlevel dielectric layers to further improve the speed of the device.

This invention can be implemented easily with present microprocessor fabrication methods and machinery, such as used to fabricate the Am 486 microprocessor. Current plasma etch tools are available to do the required etching.

INDUSTRIAL APPLICABILITY

The multilayer interconnect structure with removed interlayer silicon dioxide replaced with air or other low dielectric constant material is expected to find use in the fabrication of semiconductor devices.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A process for fabricating a semiconductor device comprising source and drain regions contacted by source and drain contacts, respectively, and each source and drain region separated by a gate region contacted by a gate electrode through a gate oxide, said source and drain contacts and said gate electrode separated by a first oxide layer, with a first level patterned interconnect contacting said source and drain contacts and said gate electrode in a desired pattern and with a second level patterned interconnect contacting said first level patterned interconnect by a plurality of metal lines, said metal lines separated by an interlevel dielectric layer, comprising the steps of:

(a) prior to forming source and drain contacts and gate electrode, forming an etch stop layer on said first oxide layer;

(b) forming said source and drain contacts to respective source and drain regions and gate electrodes over said gate oxide;

(c) forming and patterning said first interconnect layer contacting said source and drain contacts and said gate electrodes;

(d) forming on said patterned first interconnect layer said interlevel dielectric layer comprising a first dielectric material having a first dielectric constant;

(e) etching vias through said interlevel dielectric layer and forming metal lines therein contacting portions of said first interconnect layer;

(f) forming and patterning said second interconnect layer contacting said metal lines;

(g) removing at least a portion of said interlevel dielectric layer, thereby forming air spaces between said metal lines which connect said first interconnect layer and said second interconnect layer;

(h) partially filling said air spaces between said metal lines with a second dielectric material having a second dielectric constant, said second dielectric constant lower than that of said first dielectric constant; and (i) depositing a passivation layer which partially fills said air spaces between said metal lines and which leaves voids in said passivation layer or between said passivation layer and said metal lines thereby providing said interlevel dielectric layer with an effective dielectric constant that is lower than that of said first dielectric constant.

2. The process of claim 1 wherein said etch stop layer comprises silicon nitride.

3. The process of claim 2 wherein said silicon nitride has a thickness within the range of about 300 to 1,500 Å.

4. The process of claim 3 wherein said silicon nitride has a thickness within the range of about 500 to 1,000 Å.

5. The process of claim 1 wherein said first dielectric material consists essentially of silicon dioxide.

6. The process of claim 5 wherein said second dielectric material is selected from the group consisting of benzocyclobutene, polyimides, polyimide siloxanes, fluoropolyimides, fluoropolymers, fully cyclized heterocyclic polymers, and polysiloxanes.

7. A process for fabricating a semiconductor device comprising source and drain regions contacted by source and drain contacts, respectively, and each source and drain region separated by a gate region contacted by a gate electrode through a gate oxide, said source and drain contacts and said gate electrode separated by a first oxide layer, with a first level patterned interconnect contacting said source and drain contacts and said gate electrode in a desired pattern and with a second level patterned interconnect contacting said first level patterned interconnect by a plurality of metal lines, said metal lines separated by an interlevel dielectric layer, comprising the steps of:

(a) prior to forming source and drain contacts and gate electrode, forming an etch stop layer on said first oxide layer;

(b) forming said source and drain contacts to respective source and drain regions and gate electrodes over said gate oxide;

(c) forming and patterning said first interconnect layer contacting said source and drain contacts and said gate electrodes;

(d) forming on said patterned first interconnect layer said interlevel dielectric layer comprising a first dielectric material having a first dielectric constant;

(e) etching vias through said interlevel dielectric layer and forming metal lines therein contacting portions of said first interconnect layer;

(f) forming and patterning said second interconnect layer contacting said metal lines;

(g) removing at least a portion of said interlevel dielectric layer thereby forming air spaces between said metal lines which connect said first interconnect layer and said second interconnect layer; and (h) depositing a passivation layer which partially fills the air spaces between said metal lines and which leaves voids in said passivation layer or between said passivation layer and the metal lines, thereby providing said interlevel dielectric layer with an effective dielectric constant that is lower than that of said first dielectric constant.

8. The process of claim 7 wherein said etch stop layer comprises silicon nitride.

9. The process of claim 8 wherein said silicon nitride has a thickness within the range of about 300 to 1,500 Å.

10. The process of claim 9 wherein said silicon nitride has a thickness within the range of about 500 to 1,000 Å.

11. The process of claim 7 wherein said first dielectric material consists essentially of silicon dioxide.

12. A process for fabricating a semiconductor device comprising source and drain regions contacted by source and drain contacts, respectively, and each source and drain region separated by a gate region contacted by a gate electrode through a gate oxide, said source and drain contacts and said gate electrode separated by a first oxide layer, with a first level patterned interconnect contacting said source and drain contacts and said gate electrode in a desired pattern and with a second level patterned interconnect contacting said first level patterned interconnect by a plurality of metal lines, said metal lines separated by an interlevel dielectric layer, comprising the steps of:

(a) prior to forming source and drain contacts and gate electrode, forming an etch stop layer on said first oxide layer;

(b) forming said source and drain contacts to respective source and drain regions and gate electrodes over said gate oxide;

(c) forming and patterning said first interconnect layer contacting said source and drain contacts and said gate electrodes;

(d) forming on said patterned first interconnect layer said interlevel dielectric layer comprising a first dielectric material having a first dielectric constant;

(e) etching vias through said interlevel dielectric layer and forming metal lines therein contacting portions of said first interconnect layer;

(f) forming and patterning said second interconnect layer contacting said metal lines;

(g) removing at least a portion of said interlevel dielectric layer thereby forming air spaces between said metal lines which connect said first interconnect layer and said second interconnect layer;

(h) at least partially filling said air spaces between said metal lines with a second dielectric material having a second dielectric constant, said second dielectric constant lower than that of said first dielectric constant, thereby providing said interlevel dielectric layer with an effective dielectric constant that is lower than that of said first dielectric constant.

13. The process of claim 12 wherein said etch stop layer comprises silicon nitride.

14. The process of claim 13 wherein said silicon nitride has a thickness within the range of about 300 to 1,500 Å.

15. The process of claim 14 wherein said silicon nitride has a thickness within the range of about 500 to 1,000 Å.

16. The process of claim 12 wherein said first dielectric material consists essentially of silicon dioxide.

17. The process of claim 16 wherein said second dielectric material is selected from the group consisting of benzocyclobutene, polyimides, polyimide siloxane, fully cyclized heterocyclic polymers, and polysiloxanes.

* * * * *